United States Patent
Howald et al.

(10) Patent No.: US 7,196,896 B2
(45) Date of Patent: Mar. 27, 2007

(54) DECHUCKING METHOD AND APPARATUS FOR WORKPIECES IN VACUUM PROCESSORS

(75) Inventors: Arthur Howald, Pleasanton, CA (US); John P. Holland, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 192 days.

(21) Appl. No.: 10/928,152

(22) Filed: Aug. 30, 2004

(65) Prior Publication Data

US 2005/0036268 A1   Feb. 17, 2005

(51) Int. Cl.
*H01L 21/683* (2006.01)

(52) U.S. Cl. ...................................... 361/234
(58) Field of Classification Search ................. 361/234
See application file for complete search history.

(56) References Cited

U.S. PATENT DOCUMENTS

| | | | | |
|---|---|---|---|---|
| 5,221,450 A | 6/1993 | Hattori et al. | | 156/643 |
| 5,325,261 A | 6/1994 | Horwitz | | 361/234 |
| 5,444,597 A | 8/1995 | Blake et al. | | 361/234 |
| 5,463,525 A | 10/1995 | Barnes et al. | | 361/234 |
| 5,474,614 A | 12/1995 | Robbins | | 361/234 |
| 5,491,603 A * | 2/1996 | Birang et al. | | 361/234 |
| 5,507,874 A | 4/1996 | Su et al. | | 134/1 |
| 5,557,215 A | 9/1996 | Saeki et al. | | 361/234 |
| 5,573,981 A | 11/1996 | Sato | | 361/234 |
| 5,612,850 A * | 3/1997 | Birang et al. | | 361/234 |
| 5,665,166 A * | 9/1997 | Deguchi et al. | | 118/723 E |
| 5,684,669 A * | 11/1997 | Collins et al. | | 361/234 |
| 5,699,223 A | 12/1997 | Mashiro et al. | | 361/234 |
| 5,708,250 A | 1/1998 | Benjamin et al. | | 361/234 |
| 5,737,177 A | 4/1998 | Mett et al. | | 361/234 |
| 5,764,471 A | 6/1998 | Burkhart | | 361/234 |
| 5,793,192 A * | 8/1998 | Kubly et al. | | 361/234 |
| 5,818,862 A | 10/1998 | Loo | | 361/234 |
| 5,838,528 A | 11/1998 | Os et al. | | 361/234 |
| 5,847,918 A | 12/1998 | Shufflebotham et al. | | 361/234 |
| 5,880,924 A | 3/1999 | Kumar et al. | | 361/234 |
| 5,886,865 A * | 3/1999 | Parkhe et al. | | 361/234 |

(Continued)

FOREIGN PATENT DOCUMENTS

| | | |
|---|---|---|
| EP | 0 680 083 | 11/1995 |
| EP | 0 831 526 | 3/1998 |
| JP | 07 074231 | 3/1995 |
| WO | 97 12396 | 4/1997 |

*Primary Examiner*—Stephen W. Jackson
*Assistant Examiner*—Scott Bauer
(74) *Attorney, Agent, or Firm*—Lowe, Hauptman & Berner LLP (57) ABSTRACT

A glass workpiece being processed in a vacuum plasma processing chamber is dechucked from a monopolar electrostatic chuck by gradually reducing the chucking voltage during processing while maintaining the voltage high enough to clamp the workpiece. A reverse polarity voltage applied to the chuck at the end of processing assists in dechucking. The workpiece temperature is maintained at a high value at the end of processing to assisting in dechucking. Peak current flowing through the chuck during lifting of the workpiece from the chuck controls the amplitude and/or duration of the reverse polarity voltage during the next dechucking operation.

25 Claims, 4 Drawing Sheets

U.S. PATENT DOCUMENTS

| | | |
|---|---|---|
| 5,894,400 A | 4/1999 | Graven et al. ............... 361/234 |
| 5,933,314 A | 8/1999 | Lambson et al. ............ 361/234 |
| 5,956,837 A | 9/1999 | Shiota et al. ............... 361/234 |
| 6,005,376 A * | 12/1999 | Mett et al. ................... 323/281 |
| 6,228,278 B1 * | 5/2001 | Winniczek et al. ........... 216/61 |
| 6,831,823 B2 * | 12/2004 | Ishida ........................ 361/234 |

* cited by examiner

DECHUCKING METHOD AND APPARATUS FOR WORKPIECES IN VACUUM PROCESSORS

RELATED APPLICATIONS

The present application is based on, and claims priority from, U.S. application Ser. No. 09/163,368, filed Sep. 30, 1998, the disclosure of which is hereby incorporated by reference herein in its entirety.

FIELD OF INVENTION

The present invention relates generally to vacuum plasma processors including a chuck for holding workpieces in place during processing and, more particularly, to a method of and apparatus for facilitating dechucking wherein the force applied by the chuck to hold the workpiece in place during processing is effectively monitored and controlled.

Another aspect of the invention relates to such processors wherein a voltage applied to an electrostatic chuck is controlled in response to current flowing between the chuck and a source of the voltage in response to current flowing through the chuck when a previously processed workpiece was removed from the chuck.

BACKGROUND ART

Vacuum plasma processors include a vacuum chamber containing a workpiece holder, i.e., chuck, for carrying a workpiece having an exposed surface which is plasma processed, i.e., a surface which a plasma etches and/or on which a plasma deposits materials. The etching and depositing are achieved inter alia by ions in a low impedance plasma in the chamber resulting from introducing one or more suitable gases into the chamber and the application of an r.f. field to the gas.

The workpiece temperature is controlled by applying an inert heat transfer gas, such as helium, to the back face of the workpiece. The heat transfer gas improves thermal contact between the workpiece and the chuck which is cooled by water. Typically, the workpieces are relatively thin substrate plates made of electrical conducting materials (i.e., metals), semiconductors or dielectric glass sheets. The workpiece must be clamped to the chuck to hold the workpiece in place against the pressure of the heat transfer gas pushing on the workpiece back face.

Removing certain workpieces from electrostatic chucks is a problem, particularly for semiconductor workpieces, as well as low and intermediate resistivity dielectric workpieces, (i.e., dielectric workpieces with resistivities less than about $1\times10^{15}\Omega m$). Birang et al., U.S. Pat. No. 5,459,632, which appears to have the same disclosure as Birang et al., U.S. Pat. No. 5,612,850, discloses a semiconductor wafer dechucking method wherein a dechucking voltage applied to a monopolar chuck electrode has the same polarity as the polarity of the voltage used to maintain the workpiece in a chucked position. The dechucking voltage has a magnitude different from the chucking voltage to minimize the electrostatic attractive force between the chuck and workpiece. An "optimum" value for the dechucking voltage is determined empirically or by monitoring the amplitude of a current pulse produced as the workpiece is initially mounted on the chuck.

Monitoring the amplitude of the current pulse which flows through the workpiece and the electrostatic chuck when the workpiece is first applied to the chuck is not applicable to processing of glass, dielectric workpieces. This is because no current flows between the electrostatic chuck and the dielectric workpiece when the workpiece is initially placed on the chuck. For glass panels, there is no current pulse when a new panel is first lowered onto the electrostatic chuck. This is because any residual sticking charge on the previously processed dielectric workpiece left with that dielectric workpiece when it was removed from the electrostatic chuck.

As pointed out in Birang et al., U.S. Pat. No. 5,491,603, the method disclosed in the other two Birang et al. patents requires sophisticated measurements of a very short duration electrical pulse. To avoid such sophisticated measuring procedures, the '603 patent discloses a somewhat complex method of calculating the "optimum" voltage by applying an electrostatic potential to the chuck, then introducing a gas between the wafer and chuck and then reducing the electrostatic potential of the chuck while observing a rate of gas leakage from between the wafer and chuck. The optimum dechucking voltage is recorded in a memory as the value of electrostatic potential that occurs when the leakage rate exceeds a predetermined threshold. The calculated optimum voltage is apparently applied to the chuck as or after the plasma is turned off; after the plasma is turned off the wafer is lifted from the chuck. There is no disclosure in the '603 patent of controlling the chucking voltage applied to the chuck during wafer processing in response to the flow rate of gas applied to the workpiece via the chuck during processing. The '603 patent also has no disclosure of maintaining the force applied by the chuck to the wafer substantially constant during wafer processing by a plasma.

Watanabe et al., U.S. Pat. No. 5,117,121 discloses a method of releasing a semiconductor wafer from a bipolar electrostatic chuck. To clamp the semiconductor wafer workpiece to the bipolar chuck, a first DC voltage having a predetermined amplitude and polarity is applied between two chuck electrodes. After clamping by the first DC voltage and before the workpiece is removed from the chuck, a second DC voltage, having a polarity opposite to the polarity of the first voltage, is applied to the chuck electrodes to eliminate a residual attractive force which the chuck is applying to the semiconductor workpiece. The second voltage has an amplitude which is one-and-a-half to two times higher than the amplitude of the voltage of the first polarity. The second voltage is continuously applied to the bipolar electrodes for a time period inversely proportional to the amplitude of the second voltage. Apparently, the amplitudes of the first and second voltages are empirically determined. In any event, the amplitudes of the first and second voltages are not determined in response to measurements made during workpiece processing.

It is, accordingly, an object of the present invention to provide a new and improved method of and apparatus for electrostatically chucking and dechucking workpieces in a vacuum plasma processor.

An additional object of the invention is to provide a new and improved method of and apparatus for effectively measuring and controlling the forces applied to a workpiece by an electrostatic chuck during workpiece processing to facilitate removal of the workpiece from the electrostatic chuck when processing is completed and thereby increase wafer throughput.

Another object is to provide a new and improved method of and apparatus for controlling a reverse polarity voltage applied by an electrostatic chuck to a workpiece upon completion of workpiece processing to facilitate removal of the workpiece from the electrostatic chuck when processing is completed and thereby increase wafer throughput.

SUMMARY OF THE INVENTION

According to one aspect of the invention, dechucking a workpiece from a chuck of a vacuum processor is facilitated by effectively monitoring a chucking force applied to the workpiece by the chuck while the workpiece is being processed and controlling the chucking force applied to the workpiece during workpiece processing in response to the monitored force.

Preferably, the chuck is an electrostatic chuck and the chucking force is controlled by controlling the voltage applied to an electrode of the chuck. The force is preferably monitored by flowing a fluid through the chuck to the workpiece. The fluid has a tendency to move the workpiece relative to the chuck. The force applied by the chuck to the workpiece includes the combination of forces exerted by the fluid on the workpiece and the electrostatic chucking force the chuck applies to the workpiece. The forces are effectively monitored by monitoring the flow rate of the fluid acting on the workpiece. In the preferred embodiment, the fluid is a heat transfer fluid for the workpiece.

The electrostatic chuck and the workpiece are such that the electrostatic force has a tendency to increase as time progresses if the voltage is constant. This tendency is preferably overcome by decreasing the chucking voltage in such a manner as to cause the electrostatic force to remain substantially constant during workpiece processing.

Because the present invention monitors and controls the forces the chuck applies to the workpiece during workpiece processing the complex and cumbersome procedures of the '603 patent are avoided. In addition, the invention enables the forces the chuck applies to the workpiece to be substantially constant during workpiece processing. Maintaining the chucking force substantially constant during workpiece processing is highly advantageous because, inter alia, it: (1) enables more accurate control of workpiece temperature since the flow of coolant to the workpiece can be more accurately controlled, e.g., can be maintained substantially constant; and (2) enables application to the chuck of the correct reverse voltage magnitude for the correct time interval as workpiece processing is completed to attain rapid removal of the workpiece from the chuck and high workpiece throughput.

To facilitate removal of the workpiece from the electrostatic chuck, the polarity of the voltage applied to the electrostatic chuck is reversed as processing of the workpiece is completed (i.e., shortly before or when processing is completed). The reverse voltage is such as to substantially remove the chucking force applied to the workpiece. Then the workpiece is mechanically removed from the chuck. The reverse voltage is preferably controlled by monitoring current flowing in the chuck as a previously processed workpiece is removed from the chuck.

The reverse voltage magnitude and duration are preferably controlled in response to the monitored current. The reverse voltage magnitude and duration are such that the workpiece is dechucked from the chuck and is not rechucked thereby. In one embodiment, the monitored peak value of current controls the reverse voltage. In another embodiment, the integral of the monitored current during predetermined time periods controls the reverse voltage.

The above and still further objects, features and advantages of the present invention will become apparent upon consideration of the following detailed description of a specific embodiment thereof, especially when taken in conjunction with the accompanying drawings.

DESCRIPTION OF THE PREFERRED EMBODIMENTS

Figure 1:
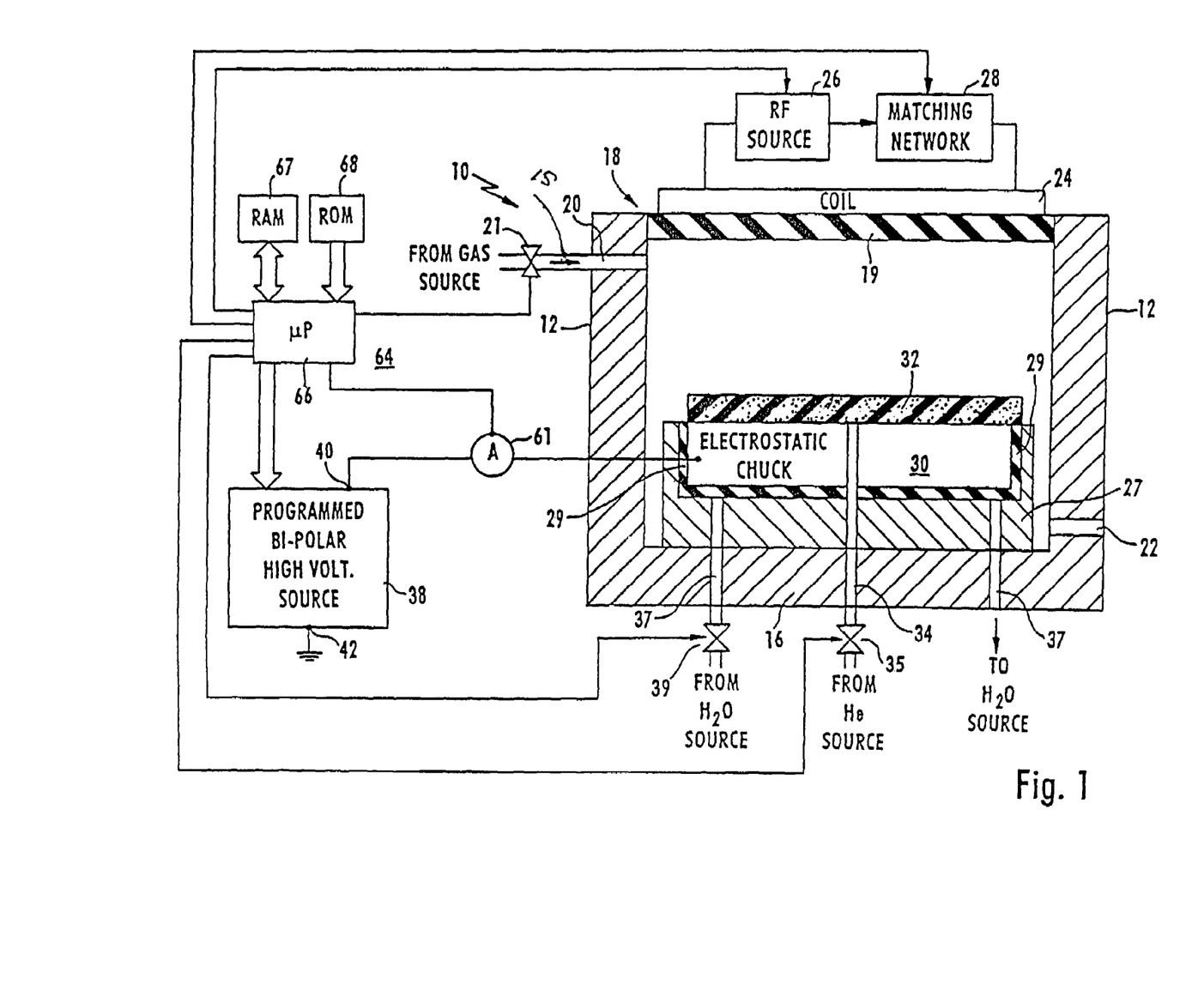
FIG. 1 is a schematic view of a vacuum plasma processor including an electrostatic chuck for holding a glass, dielectric sheet workpiece in situ.

Reference is now made to FIG. 1 of the drawing, wherein a plasma processor that can be used for etching a dielectric substrate or for depositing films on the dielectric substrate is illustrated as including vacuum chamber 10, preferably configured as a right parallel piped having electrically grounded, sealed exterior surfaces formed by rectangular metal, preferably anodized aluminum, sidewalls 12. Vacuum chamber 10 also includes rectangular metal, preferably anodized aluminum, bottom end plate 16 and rectangular top end plate structure 18, including dielectric window structure 19. Sealing of these exterior surfaces of chamber 10 is provided by conventional gaskets (not shown).

A suitable gas that can be excited to a plasma is supplied to the interior of chamber 10 from a gas source (not shown) via line 15, port 20 and valve 21. The interior of chamber 10 is maintained in a vacuum condition, at a pressure typically in the range of 0.5–100 milliTorr, by a vacuum pump (not shown) connected to port 22 in sidewall 12. The gas in vacuum chamber 10 is excited to a plasma condition by a suitable electric source, such as substantially planar coil 24, mounted immediately above window 19 and excited by r.f. source 26 via matching network 28 including automatically controlled reactances (not shown). It is to be understood however that any suitable method of plasma generation can be employed.

Electrostatic chuck 30 is fixedly mounted in chamber 10 on a support structure including grounded metal base 27 that is electrically decoupled from the chuck by electrical insulating sheets 29; base 27 is fixed to bottom end plate 16. Chuck 30 is particularly designed to selectively hold workpiece 32 including a non-plastic dielectric substrate, typically a flat glass substrate sheet used to form a flat panel display. The glass can be any of several different types having determined passive electric characteristics, e.g.

determined dielectric constants and resistivities. The glass resistivity is characterized by having one of low, intermediate or high ranges such that the low resistivity is between about $1\times10^8$ and about $1\times10^{11}$ ohm·1 meters (Ω·m)2, the intermediate resistivity is between about $2\times10^{11}$ and about $1\times10^{15}$ Ω·m3, and the high resistivity exceeds about $1\times10^{15}$ Ω·m4.

The resistivities depend on the glass chemical composition and temperature, with resistivity decreasing as temperature increases; all of the glass workpieces decrease in resistivity approximately 2.5 times for each 10° C. temperature increase. The dielectric constants of the glass workpieces range between about 5.6 and 7.7, i.e. are about 6½. The dielectric constants and resistivities of three exemplary types of glasses in the low, intermediate and high resistivity ranges are respectively set forth on the three lines of Table I.

TABLE I

| Glass Type | Dielectric Constant | Resistivity (Ω · m) | | |
|---|---|---|---|---|
| | | 20 deg C. | 60 deg C. | 80 deg C. |
| Soda lime | 7.6 | $1 \times 10^{11}$ | $4 \times 10^9$ | $8 \times 10^8$ |
| Borosilicate | 6.7 | $5 \times 10^{13}$ | $1 \times 10^{12}$ | $2 \times 10^{11}$ |
| Aluminosilicate | 5.7 | | | $10^{15}$ |

The glass sheets typically have a nominal thickness of 1.1 mm, a thickness tolerance of ±0.1 mm, and very smooth faces, with a maximum peak to peak roughness of 0.02 microns. The glass sheets, as produced, may be slightly warped or wavy. After going through various process steps, especially deposition, the glass sheets can become considerably more warped or wavy, resulting in a greater need to flatten substrate sheet 32 during plasma processing thereof in chamber 10.

The temperature of workpiece 32 typically is controlled to be between 25° and 100° C. by supplying helium gas from a suitable source (not shown) via conduit 34 and valve 35 through chuck 30 to the workpiece back face, i.e., to the face of the glass substrate not exposed to the ions in processing chamber 10, and by supplying a coolant liquid, e.g., a mixture of water and ethylene glycol, to chuck 30 via conduits 37 and valve 39 from a suitable source (not shown). Typically, the pressure of the helium gas applied to the back face of workpiece 32 is in the 5–15 Torr range and the helium flow rate through conduit 34 is in the 5–70 sccm range. The helium flows from the source through a pressure transducer into conduit 34 via a stem and one arm of a "T" connection, the other arm of which is connected through an orifice having a controlled opening to a pump. In all embodiments, the pressure of helium applied to the workpiece back face is maintained substantially constant by a flow controller in conduit 34. For all the coolant flow rates, the pressure of the gas applied to the back face of workpiece 32 is sufficient to push glass sheet 32 off chuck 30, i.e., to move the sheet relative to the chuck, if the chuck applies no electrostatic force to the workpiece. The helium gas cools workpiece 32 by transferring heat, by conduction, between the workpiece and chuck 30. Chuck 30 acts as a relatively cool heat sink because of the liquid coolant flowing to it via conduit 34.

Chuck 30 is constructed so a high thermal conductivity path is provided through the chuck to substrate 32 from the cooling liquid flowing through conduits 37.

Figure 2:
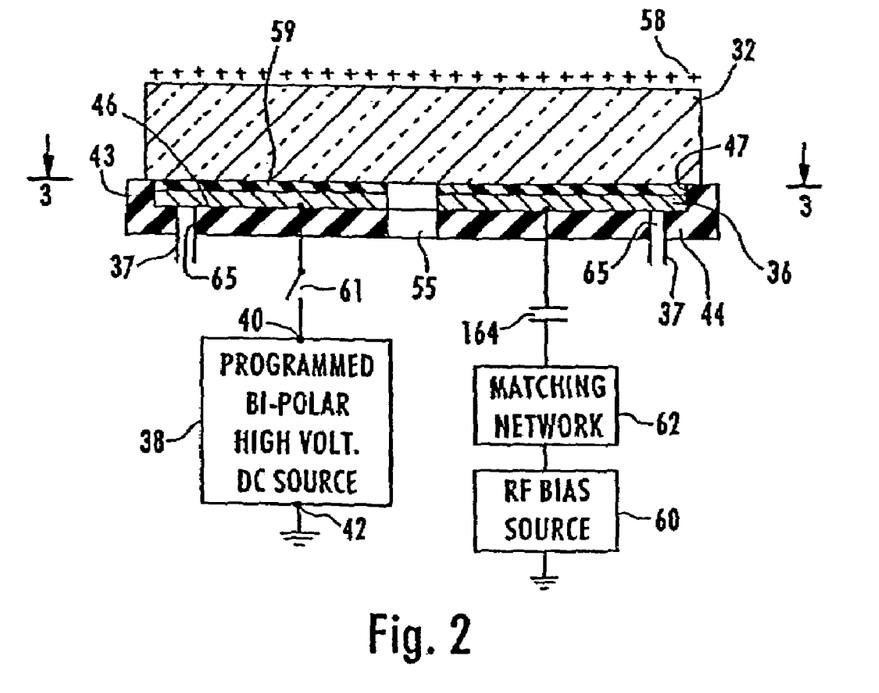
FIG. 2 is a side sectional view of a monopolar electrostatic chuck embodiment particularly adapted to be used in the processor of FIG. 1, in combination with the glass, dielectric sheet workpiece.
Figure 3:
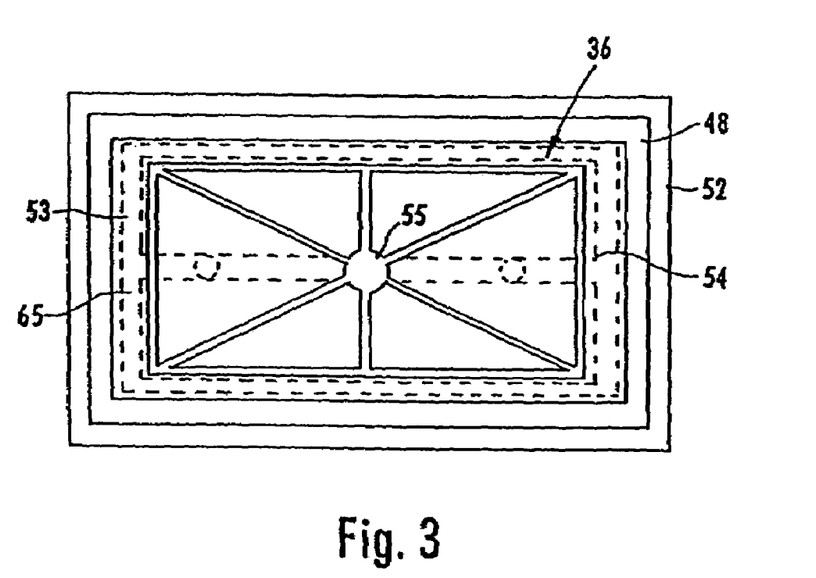
FIG. 3 is a top view of the structure illustrated in FIG. 2, without the glass, dielectric sheet workpiece in situ.

The back face of workpiece 32 abuts a flat planar face of chuck 30, except in portions of the chuck face that are grooved. Chuck 30 applies a force to the workpiece so the exposed surface of the workpiece is flat and lies in a plane substantially parallel to the chuck flat planar face. This result is achieved even though workpiece 32 may be warped or wavy when put onto the chuck and despite the tendency of the helium gas flowing through conduit 34 to bow the workpiece upwardly into chamber 10 away from the flat planar face of chuck 30. Chuck 30 is also constructed so the helium gas contacts a substantial portion of the back face of workpiece 32 even though the back face of the workpiece abuts ungrooved portions of the flat planar face of chuck 30. As illustrated in FIGS. 2 and 3, electrostatic chuck 30 is a monopolar device having only one electrode formed as high electrical conductivity metal (preferably aluminum) plate 36, connected to high voltage terminal 40 of programmed DC source 38, including a low pass r.f. rejection filter (not shown). During initial processing of workpiece 32 by the plasma in chamber 10 the voltage at terminal 40 is typically several thousand volts, e.g., 5000 volts, relative to the voltage of source 38 at grounded terminal 42, connected to a metal wall of housing 10. Terminal 42, chamber 10 and the plasma in the chamber are all at about the same DC ground (i.e., reference) potential. Voltage source 38 can be constructed so terminal 40 is at either a negative or positive voltage relative to the voltage at grounded terminal 42. During processing of workpiece 32 by the plasma in chamber 10 the voltage at terminal 40 is preferably negative with respect to terminal 42 to attract relatively low mobility positive ions to the exposed face of workpiece 32. The negative polarity is advantageous because it reduces the likelihood of deleterious effects on power supply 38.

A radio frequency bias voltage is supplied to chuck 30 for ion energy control. To this end, r.f. source 60 is connected via matching network 62 and series DC blocking capacitor 164 to plate 36 of chuck 30. The AC bias voltage causes chuck 30 to become charged to a negative DC voltage because the highly mobile plasma electrons are attracted to the chuck to a much greater extent than the low mobility heavy plasma ions.

The front of plate 36, i.e. the face of the plate closest to glass workpiece 32, is covered by protective electric insulator 59, preferably formed as an anodized, non-outgassing layer completely covering the plate 36 front face. Insulator layer 59 typically has a thickness of about 0.1 mm, and determined passive electric parameters, e.g. determined dielectric constant and resistivity which lead to determined capacitance and resistance.

The remainder of plate 36 is surrounded by dielectric electric insulator body 44, also made of a material which does not out-gas (usually not a plastic and preferably a ceramic). Body 44 prevents electrode plate 36 from electrically contacting the ions in chamber 10 so there is a substantial DC potential difference between the electrode and ions in the chamber. To this end, insulator body 44 is shaped as a plate having recess 46 therein. Metal plate 36 is located in recess 46 such that peripheral edges of the plate abut interior walls 47 of flanges 48 of body 44 and workpiece 32 is sized relative to plate 36 so the substrate completely covers the plate 36 upper surface.

To enable helium gas flowing through conduit 34 to contact a substantial portion of the back face of glass workpiece 32, smooth planar upper face 53 of plate 36 is provided with spaced, interconnected grooves 54 (FIG. 3), all of which are in fluid flow relation with each other and conduit 34. Conduit 34 effectively extends through chuck 30 by virtue of the chuck including central bore 55 to which the conduit and grooves are connected. When workpiece 32 is clamped in place on chuck 30, the exposed planar upper face of the workpiece extends in a plane parallel to upper face 53. Insulator body 44 includes passages 65, in fluid flow relation with conduits 37 so the coolant liquid flows through the passages. Heat is readily transferred from workpiece 32 to the coolant in passages 65 since insulator body 44 and metal plate 36 have a high thermal conductivity and there is a short distance between the passages and workpiece 32.

In operation, a glass dielectric substrate workpiece 32, of the types described supra, is placed on insulating layer 59 when the voltage of DC source 38 connected to electrode 36 is zero by virtue of the DC source being disconnected from its energizing power supply (not shown). After workpiece 32 has been placed on layer 59 completely surrounded by dielectric body 44, source 38 is connected to its energizing power supply. Cooling gas is then supplied to conduit 34 by opening valve 35.

Workpiece 32 is placed on chuck 30 by a robotic arm (not shown) that delivers the workpiece to a set of vertically driven metal, lifting pins (not shown) that are electrically connected to chuck electrode 36 and extend vertically through the chuck and are raised above the chuck top face. Because workpiece 32 is glass, the workpiece bottom face is at a voltage independent of the voltages of electrode 36 and the lifting pins. When the pins are lowered, workpiece 32 rests on insulator 59 and is spaced from the pins. After processing has been completed, sometimes while a small clamping force is applied by chuck 30 to workpiece 32, the workpiece is removed from the chuck by raising the pins against the workpiece. The pins then return the processed workpiece to the robotic arm.

Charge layer 58 forms on the exposed, top surface of glass workpiece 32 because the exposed surface contacts ions substantially at the reference potential in chamber 10. Consequently, layer 58 is at a reference potential close to the ground voltage of chamber 10. When source 38 is turned on and switch 61 closed, current flows from terminal 40 to electrode 36, displacement current flows from electrode 36 through insulating layer 59 and glass workpiece 32, and current flows from the exposed top layer of workpiece 32 through the plasma in chamber 10 to the chamber walls, thence to the ground terminal 42 of source 38 to complete the circuit. This current flow results in charging of the dielectric of a capacitor formed between electrode 36 and the top surface of workpiece 32. The voltage of source 38 is sufficiently high that the charge on the dielectric of the capacitor formed between the electrode 36 and the top surface of workpiece 32 produces an attractive force between workpiece 32 and electrode 36 sufficient to clamp the workpiece to chuck 30.

The voltage of source 38 is sufficiently high that the charge across the thickness of workpiece 32 produces an attractive force across the workpiece to clamp the workpiece (i.e., substrate) to the upper face 53 of insulating layer 59. The value of the voltage of source 38 (typically on the order of 5000 volts) required to clamp glass dielectric workpiece 32 is considerably higher than the voltage required to clamp a semiconductor or metal workpiece to a monopolar electrostatic clamp. The high voltage is necessary to establish the clamping pressure from electrode plate 36 across the thicknesses of workpiece 32 and insulating layer 59 to the charge layer on exposed face of the workpiece. Usually the clamping force applied to workpiece 32 is about twice the force applied to the backside of the workpiece by the He flowing through conduit 34.

For the low and intermediate resistivity glass workpieces, there is a tendency for charges and voltages to remain on workpiece 32 when processing is completed; the charge and voltage stay on the glass workpiece as the pins raise the workpiece from chuck 30. When glass workpiece 32 is not completely released from chuck 30 and when the processing plasma is on to complete the electrical circuit, charge is trapped on the bottom of the glass workpiece, and image charges form on the top of the glass workpiece and on electrode 36. The image charge is on electrode 36 because the image charge is attracted to the trapped charge on the bottom face of workpiece 32.

As workpiece 32 is lifted from chuck 30 while a plasma is in chamber 10 to maintain the workpiece upper face at the reference voltage, charge is transferred between electrode 36 and the workpiece top face because the capacitance between the electrode and the workpiece bottom face decreases. Consequently a current pulse flows between electrode 36 and the bottom face of glass workpiece 32 as the pins lift the glass workpiece from chuck 30.

The amplitude of the current pulse is monitored by ammeter 61, connected between plate 36 and terminal 40 of source 38. The peak reading of meter 61 is directly proportional to the residual voltage and charge on workpiece 32 as the pins lift the workpiece from chuck 30. Alternatively, the instantaneous amplitude of the current sensed by meter 61 is detected for a predetermined period starting a few microseconds after the pins begin to lift workpiece 32 and ending before the pulse is over. The instantaneous output of meter 61 is integrated during the period. Computer system 64 determines peak amplitude or integrates the value of current sensed by meter 61. As described infra, computer system 64 responds to the reading of meter 61 to control the clamping force chuck 30 applies to at least one subsequently processed glass workpiece 32 while such a workpiece is removed from the chuck.

Computer system 64, including microprocessor 66, random access memory (RAM) 67 and read only memory (ROM) 68, controls the amplitude of a time varying voltage derived by source 38, opening and closing of valves 21, 35 and 39, as well as turning on and turning off of r.f. source 26 and the reactive impedances of matching network 28. Microprocessor 66 responds to a program stored in ROM 68, to signal values stored in RAM 67, and to the amplitude of the current in the pulse sensed by ammeter 61 to control valves 21, 35, 39, high voltage source 38 and r.f. source 26. In addition, microprocessor 66 responds to values of (1) output power of source 26 and (2) power reflected back to the source, as derived from suitable transducers (not shown), to control the reactances of matching network 69. The operations stored in ROM 68 to control source 38, valves 21, 35 and 39, as well as energization of source 26, are described infra. The operations performed by microprocessor 66, except for control of the reactances of matching network 28, can also be performed manually.

The different types of glass workpieces used for flat panel displays have different passive electric properties, e.g., resistivities and capacitances, that affect dechucking glass substrates 32 from chuck 30. High resistivity glass dielectric substrates 32, when clamped to chuck 30, are easily released from the substrate when the voltage applied by source 38 to the chuck is reduced to zero. As indicated supra, we found that low and intermediate resistivity dielectric workpieces 32 are not released from chuck 30 when the high voltage applied to the chuck is reduced to zero. The differing resistivities, in particular, affect the charges stored in the glass dielectric workpieces and can adversely effect the ability to remove the workpieces quickly from chuck 30.

Figure 4A:
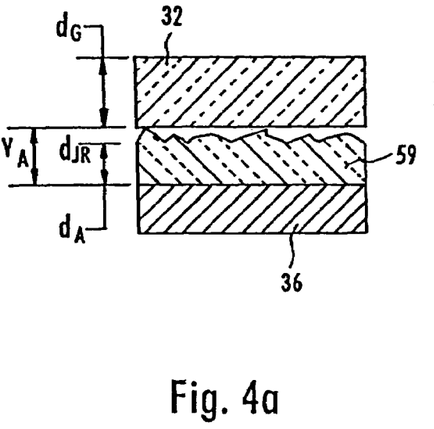
FIGS. 4a, 4b and 4c are respectively cross-sectional views of a monopolar electrostatic chuck clamping a glass dielectric workpiece, an equivalent circuit of the chuck clamping the workpiece and an approximate equivalent circuit of the chuck clamping the workpiece.
Figure 4B:
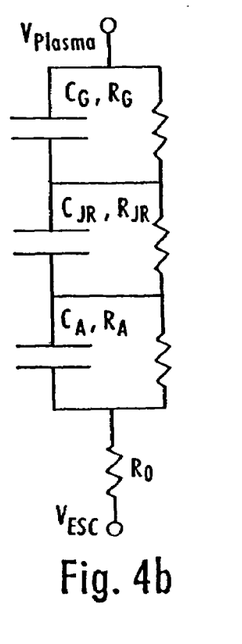
Figure 4C:
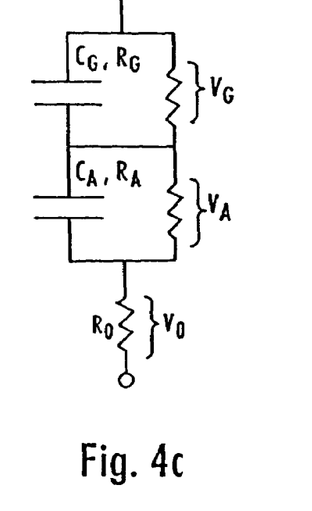

FIGS. 4a, 4b and 4c are respectively (a) a cross-sectional view of chuck 30 (including metal plate 36 and insulator layer 59) and clamped glass dielectric workpiece 32, (b) an approximate equivalent circuit diagram of the structure of FIG. 4a and (c) an approximate circuit diagram of the structure of FIG. 4a. The structure illustrated in FIG. 4a, in addition to comprising insulator 59 between metal plate 36 and glass 32, includes a vacuum gap between the insulator top face and the glass workpiece 32 bottom face. the gap is frequently referred to as a Johnsen-Rahbek gap. Insulator 59, the gap and glass workpiece 32 have known approximate thicknesses of $d_A$, $d_{JR}$ and $d_G$, respectively. The impedance to DC source 38 of each of insulator 59, the gap and glass workpiece 32 can be represented as a capacitor in parallel with a resistor; the capacitors and resistors are respectively represented in FIG. 4b by $C_A$, $R_A$ for the capacitance and resistance between the top face of electrode plate 36 and the top face of insulator layer 59, $C_{JR}$, $R_{JR}$ for the capacitance and resistance between the top face of insulator layer 59 and the bottom face of glass workpiece 38, i.e., of the Johnsen-Rahbek gap, and $C_G$, $R_G$ for the capacitance and resistance between the top and bottom faces of glass workpiece 32. The parallel equivalent passive circuit components of insulator 59, the Johnsen-Rahbek gap and glass workpiece 32 are series connected to each other. The top face of glass workpiece 32 is at the approximately reference (i.e., ground) voltage of the plasma in chamber 10. The bottom face of insulator layer 59 is connected to the power supply voltage ($V_{ESC}$) of DC source 38 through electrode plate 36 and resistor $R_0$, equal to the resistance of the source. The bottom face of workpiece 32 is at some voltage between the voltage of source 38 and the exposed face of the workpiece during processing. For intermediate and low resistivity glass workpieces, as described supra in connection with Table I, the Johnsen-Rahbek gap resistance is much greater than the resistance of insulator layer 59, which in turn is greater than the resistance of dielectric glass workpiece 32. For the time scales of interest, involved in dechucking low and intermediate resistivity glass dielectric workpieces from chuck 30, the combination of insulator layer 59 and Johnsen-Rahbek gap 30 can be treated as a single layer having a resistance and capacitance equal approximately to the insulator resistance ($R_A$) and the insulator capacitance ($C_A$).

This leads to the approximate equivalent circuit illustrated in FIG. 4c, wherein the parallel combination of the capacitance $C_A$ and resistance $R_A$ of insulator 59 is in series with the parallel combination of the capacitance $C_G$ and resistance $R_G$ of glass workpiece 32. The series combination of FIG. 4c, i.e., $C_A$ in parallel with $R_A$ and $C_G$ in parallel with $R_G$, is in series with resistor $R_0$, the resistance of source 38. (The circuitry of FIG. 4C and the resulting calculations are approximate because they treat the resistances of workpiece 32 and insulator 59 as ohmic which is not actually the case. However, the circuitry of FIG. 4C and the resulting calculations are accurate enough to be useful because they show there are fast and slow time constants and a voltage polarity reversal when the voltage of source 38 is no longer applied to chuck 30.)

The current from source 38 establishes the time varying voltages $V_0$, $V_A$ and $V_G$ which are, respectively, (1) across resistor $R_0$, (2) between the top face of metal plate 36 and the bottom face of glass workpiece 32 (i.e., across insulator layer 59), and (3) across glass workpiece 32. The voltage applied by source 38 to the electrostatic chuck including plate 36, insulator 59 and the glass dielectric workpiece 32 is $$V_{ESC} = (V_0 + V_G + V_A + V_{plasma})$$

where $V_{plasma}$ is the voltage the plasma applies to the top, exposed face of glass dielectric substrate 32.

The clamping force applied to glass workpiece 32 is $$F = \varepsilon_0 k_A^2 V_A^2(t) \frac{A}{2d_A^2} \ldots 5, \tag{1}$$

where $k_A$ is the dielectric constant of insulator layer 59,
$\varepsilon_0$ is the permittivity of free space, and
A is the area of the bottom face of glass workpiece 32 which is substantially equal to the area of the top face of insulator layer 59.

In response to a step voltage change of source 36 causing a step voltage transition of $V_{ESC}$, the value of $V_A(t)$ is:

$$V_A(t) = C_A^+ \exp(-A^+ t) + C_A^- \exp(-A^- t) + V_{A\infty} \tag{2}$$

where:
$A^\pm = (f_G r_G + f_A r_A \pm s)/2$,
$C_A^\pm = [A^\pm(V_{A\infty} - V_{A0}) + f_A(r_A V_{A0} + V_{G0} - V_{ESC} + V_{plasma})]/(\pm s)$
$f_G = 1/(C_G R_0)$, $f_A = 1/(C_A R_0)$, $r_G = (1 + R_0/R_G)$, $r_A = (1 + R_0/R_A)$,
s=sqrt $((f_G r_G - f_A r_A)^2 + 4 f_G f_A)$, (sqrt signifies square root)
$V_{A\infty} = V_2(t \to \infty)$, $V_{A0} = V_A(t=0)$, $V_{G0} = V_G(t=0)$ The time constant $\tau^+ = 1/A^+6$ is typically less than 1 second and corresponds to charging the series combination capacitance $(C_G * C_A)/(C_G + C_A)$ through external resistance $R_0$. Time constant $\tau^+$ governs changes in the total voltage of the equivalent circuit defined by $(V_G + V_A)$ and is the appropriate turn-on time constant for chuck 30 to workpiece 32. Changes that occur with time constant $\tau^+$ involve movement of equal amounts of displacement charge through both capacitors $C_A$ and $C_G$. The discharge time constant of electrostatic chuck 30 and dielectric workpiece, $\tau^- = 1/A^- 7$, is for the free flow of charge onto the series capacitors $C_G$ and $C_A$ through resistors $R_0$, $R_A$ and $R_G$. The discharge time constant $\tau^-$ approximately equals the product of (1) the smaller of the resistances of insulator 59 or glass workpiece 32 and (2) the larger of the capacitances of insulator 59 or workpiece 32. The smaller resistance and larger capacitance are respectively $R_G$ and $C_A$. The product $R_G C_A$ for the intermediate resistivity workpieces is typically orders of magnitude greater than $\tau^+$. $\tau^-$ is the time constant usually governing gradual increases in the clamping force of glass substrate 32 to electrostatic chuck 30, and the decay of the residual clamping force applied by chuck 30 to workpiece 32 after the voltage of source 38 has dropped to zero.

Figure 5:
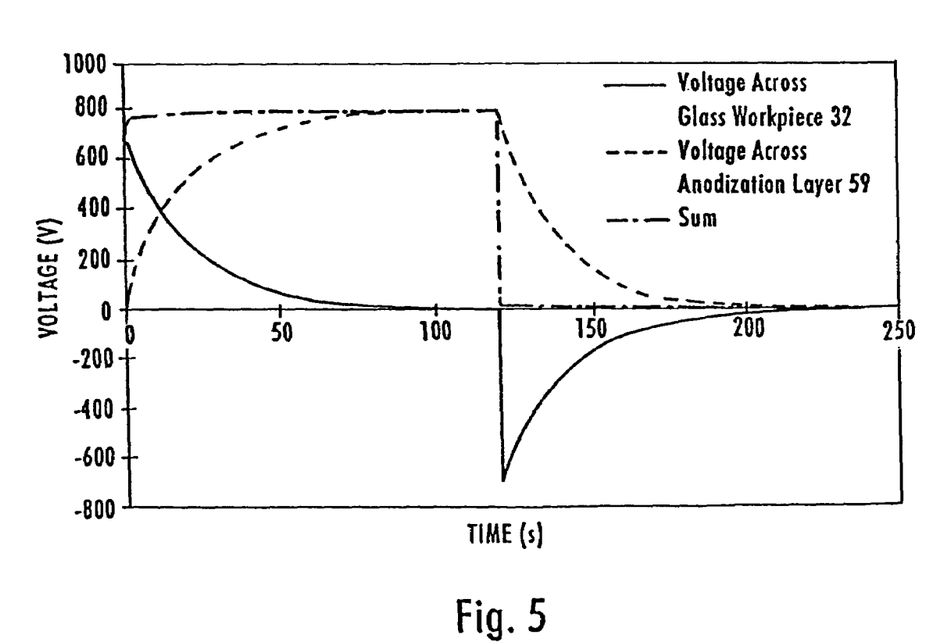
FIG. 5 is a waveform helpful in describing an embodiment of the invention involving clamping an intermediate resistivity glass workpiece.

The effects of the two time constants $\tau^+$ and $\tau^-$ are illustrated by the waveforms of FIG. 5, analytic solutions for the voltages $V_G$ and $V_A$ as a function of time for step changes from $V_{ESC} = 0V$ to $V_{ESC} = 800V$ for $0 < t < 120$ s after the positive step change, and from $V_{ESC} = 800$ to $V_{ESC} = 0$ after 120 s. For FIG. 5, $C_A$ is 20 times larger than $C_G$, $R_A$ is an order of magnitude greater than $R_G$, the time constant $\tau^+$ is 0.04 s, and the time constant $\tau^-$ is 20 s. These component and time constant values are for a temperature of 40° C. for a particular intermediate resistivity glass used for commercial flat panel displays. When the 800V level is applied to insulator 59 while the workpiece 32 exposed face is at ground, the voltage sum ($V_G+V_A$) rapidly increases to 800V with the time constant $\tau^+$. The initial voltage division between $V_G$ and $V_A$ is established by the capacitive voltage divider ratio. After initial turn on of the 800V source, $V_G$ decreases and the clamping voltage $V_A$ increases toward the resistive voltage divider values of the glass workpiece and insulator with the time constant $\tau^-$. At t=120 s, the ESC voltage is turned off, i.e., ESC=0, and the sum voltage rapidly decreases to zero with the time constant $\tau^+$. The voltage on the capacitor $C_A$ or $C_G$ with the smaller product $C_A*R_A$ or $C_G*R_G$ changes polarity with the smaller $\tau^+$ time constant, and then the voltages on both capacitors decay with the longer time constant $\tau^-$.

Since the resistivity of different glasses used in the manufacture of flat panel displays varies by over five orders of magnitude (as indicated by Table I), the time constant $\tau^-$ is also highly variable, and no one dechucking procedure is effective for all types of glass.

Since $R_AC_A>R_GC_G$ for low and intermediate resistivity glass workpieces clamped to chuck 30, the clamping voltage $V_A$ applied by electrode 36 through insulator 59 to the bottom face of such workpieces increases with time after chuck 30 has been supplied by source 38 with a constant amplitude DC voltage. To attain a suitable dechucking time, it is desirable during workpiece processing by the plasma to maintain the clamping voltage $V_A$ at an approximately constant value sufficient to cause workpiece 32 to remain stuck in situ against the force of the cooling fluid flowing through conduit 37. This can be achieved by reducing, as a function of time, the value of the voltage applied by source 38 to chuck 30 after the workpiece has been clamped.

Ideally, the value of $V_{ESC}$ derived by source 38 is reduced exponentially, to maintain the chucking voltage $V_A$ and chucking force substantially constant during processing of the dielectric, glass workpiece 32. However, it is somewhat difficult to program an exponential function into ROM 68 and to control the amplitude of a high voltage source so it is an exponentially decreasing function of time. The exponential decreasing voltage and the effects attained thereby can be approximated to a large extent by ROM 68 storing a program which causes microprocessor 66 to control source 38 so the source derives a sequence of time spaced decreasing step voltages during processing of glass, dielectric workpiece 32 by the plasma in chamber 10. For example, the exponential decreasing voltage during processing can be approximated by source 38 initially applying a voltage of −1500 volts to plate 36 during the first 15 seconds of glass dielectric workpiece 32 processing. ROM 68 then controls microprocessor 64 to cause the output voltage of source 38 to decrease to −800 volts for a period subsisting between 15 and 45 seconds of workpiece processing. Then ROM 68 controls microprocessor 66 so the voltage of source 38 drops to −600 volts during the interval of 45 to 75 seconds of processing time. After 75 seconds of processing time, ROM 68 causes microprocessor 66 to drop the output voltage of source 38 to −500 volts. With relatively short processes, having a duration on the order of 60 seconds, such a processing sequence can cause the stored clamping charge in insulator 59 to be sufficiently low as to enable glass workpiece 32 to be lifted from the insulator without damage. This process is particularly applicable for intermediate resistivity glass workpieces. The high resistivity glass workpieces need not employ the programmed voltage source and the prior art, constant voltage technique is suitable for dechucking purposes.

In accordance with a further embodiment, the voltage of source 38 is continuously controlled while workpiece 32 is being processed so the clamping force chuck 30 applies to the workpiece is approximately constant. Such a result is achieved by controlling the voltage of source 38 to maintain the flow rate of helium coolant flowing through conduit 34 against the back face of workpiece 32 constant, at a set point value, whereby the clamping force is substantially constant during workpiece processing.

Figure 7:
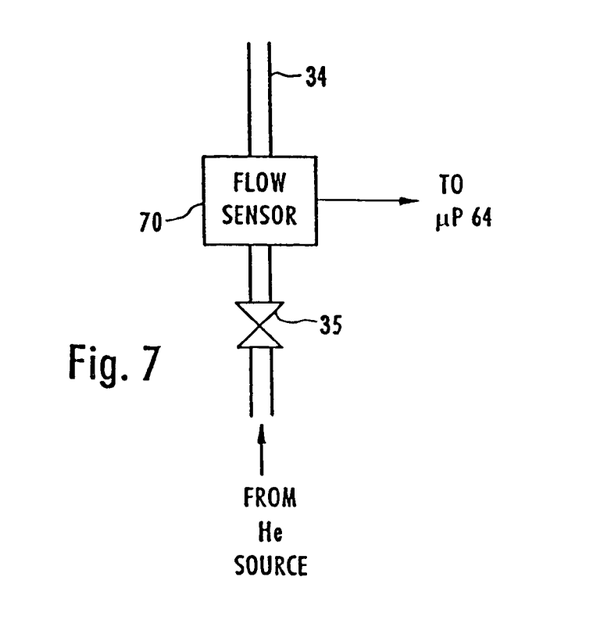
FIG. 7 is a partial schematic view of a further embodiment of the invention wherein the voltage applied to the chuck during processing is controlled to maintain the coolant flow rate constant.

To this end, flow sensor 70 is connected in helium conduit 34 between value 35 and bore 55. Sensor 70 develops a signal proportional to the helium flow rate as averaged over a relatively long time interval, e.g., a few seconds. The averaged output of sensor 70 effectively indicates the chucking force chuck 30 applies to workpiece 32. The signal is supplied to an input of microprocessor 66 where it is compared with a preset flow rate signal value stored in ROM 68. The comparison results in a relatively long time constant control that microprocessor 66 continuously supplies to source 38 so the source voltage is varied to maintain the clamping force chuck 30 applies to workpiece 32 approximately constant during workpiece processing. Microprocessor 66 is preferably programmed to control the voltage of source 38 by applying an error (difference) signal resulting from the comparison to a proportional, integral, differential (PID) controller. Short time constant control is provided by a conventional pressure sensor (not shown) responsive to the gas pressure exerted by the helium gas on the back face of substrate 32. The pressure sensor, in combination with microprocessor 66 controls the pressure of the helium gas supplied to valve 35 and line 34.

Control of the voltage of source 38 in response to the output signal of sensor 70 is based on the realization that the helium flow rate (1) decreases in response to increases of clamping force by chuck 30 on workpiece 32 and (2) increases in response to decreases of clamping force by chuck 30 on workpiece 32. As soon as source 38 initially applies a constant DC voltage to chuck 30, the clamping force applied to workpiece 32 begins to increase exponentially, causing the flow rate of coolant through conduit 34 to decrease. The decreased flow rate is detected by sensor 70, to cause microprocessor 66 to decrease the DC voltage that source 38 applies to chuck 30 so the chucking force remains approximately constant. Operation continues in this manner throughout the time workpiece 32 is processed.

For many intermediate and low resistivity glass workpieces, particularly those processed by the plasma for more than one minute, the charge stored in the workpiece at the completion of the processing interval is likely to be sufficiently large to prevent the workpiece from being removed by the pins from chuck 30, even though the voltage supplied by source 36 to the workpiece has decreased as a function of time. In these situations, after workpiece processing has been completed and while a low power plasma is in chamber 10 so the voltage at the workpiece exposed face is approximately zero, ROM 68 activates microprocessor 66 to cause source 38 to supply to terminal 40 a DC voltage having a polarity opposite to the polarity of the voltage supplied to terminal 40. The opposite, i.e., reverse, polarity voltage is applied after the voltage of source 36 has been reduced during processing.

In accordance with a second embodiment, the amplitude of the reverse polarity voltage supplied by source 38 to terminal 40 is predetermined at a relatively high value, such as +4000 volts; the +4000 volt value is applicable to a situation wherein the voltages of source 36 are sequentially −1500V, −800V, −600V and −500V during processing. The reverse polarity voltage magnitude is selected to be such that $V_A$ (the voltage between the top face of electrode 36 and the bottom face of glass workpiece 32) is zero, which causes a substantial increase in $V_G$ (the voltage between the top and bottom faces of glass workpiece 32).

The magnitude of the reverse polarity voltage must be sufficient to attain this result, bearing in mind that the relative impedances of insulator 59 and glass workpiece 32 are such that only 5% to 10% of the voltage of source 38 is developed across capacitor $C_A$. This dechucking method is for cases when the regular dechucking time constant $\tau^-$ is very long. The very long time constant $\tau^-$ can come about, for example, if the glass workpiece becomes stuck during high temperature processing. The high temperature reduces the workpiece resistivity and thus causes the sticking/dechucking time constant to be faster than at lower temperatures.

However, after processing the plasma is extinguished which causes dechucking to take place at a lower temperature which causes a much slower time constant. Even though it would take a very long time for all the charges on all of the capacitors to decay to zero with time constant $\tau^-$, the voltage on any one particular capacitor can still be reduced to zero at the fast time constant $\tau^+$, at the expense of increasing the voltages on other capacitors. However, this method can be used to free a stuck workpiece, since only the voltage $V_A$ (in this equivalent circuit model) is directly related to the sticking force. For this dechucking method, there is not any particular length of time for which the reverse polarity voltage should be applied, other than a time longer than $\tau^+$.

After the voltage across capacitor $C_A$ drops to zero, the plasma in chamber 10 is turned off by microprocessor 66 closing valve 21 and turning off r.f. source. Then microprocessor 66 activates a pump (not shown) to pump out chamber 10 to a pressure less than 1 milliTorr (preferably, at least an order of magnitude less than 1 milliTorr) while electrode 36 is still connected to voltage source 38. This causes the circuit through the plasma to chamber walls 12 to be broken. Then microprocessor 66 commands the voltage of source 38 to be reduced to zero. The value of voltage $V_A$ remains zero and the value of voltage $V_G$ remains relatively large.

Then microprocessor 66 commands the lifter pins to remove glass workpiece 32 from chuck 30; the voltage $V_G$ (the voltage between the top and bottom faces of glass workpiece 32) remains quite high even after the pins lift the workpiece from chuck 30. Microprocessor 66 then performs operations causing the value of voltage $V_G$ to be reduced substantially to zero by causing formation of an inert plasma in chamber 10. The plasma is preferably formed by introducing an inert ionizable gas, e.g., argon, into chamber 10 and applying an r.f. field to the gas from source 26, via matching network 28 and coil 24. Alternatively, the charge on lifted workpiece 32 is removed by igniting a DC Townsend discharge in chamber 10.

The steps can be rearranged so the workpiece 36 is removed from chuck 30 before the chucking voltage of source 36 applied to electrode 32 is reduced to zero. Then the pins lift glass substrate 32 from chuck 30 when the reverse polarity voltage has been on for a sufficient length of time to cause the voltage of capacitor $C_A$ to be approximately zero. If the voltage of source 38 was not previously reduced to zero, the voltage of the source is then reduced to zero.

In a first reverse polarity embodiment, the reverse polarity voltage is supplied by source 38 to plate 36 until substantially equal charges are present on capacitors $C_A$ and $C_G$, i.e., there is charge balance between capacitor $C_A$ (defined by the volume between the bottom face of insulator 59 and the bottom face of workpiece 36) and capacitor $C_G$ (defined by the volume between the bottom and top faces of workpiece 32). When there are approximately equal charges across capacitors $C_A$ and $C_G$ the voltage across capacitor $C_A$ is $$V_A = \frac{V_G C_G}{C_A} 8.$$

ROM 68 is programmed so that when $$V_A = \frac{V_G C_G}{C_A} 9,$$

microprocessor 66 reduces the voltage of source 38 at terminal 40 to the ground potential at terminal 42. After the voltage at terminal 40 has been reduced to zero, the voltages $V_A$ and $V_G$ decay quickly with the short time constant $\tau^+$.

Based on the determined values of $R_G$, $R_A$, $C_G$ and $C_A$, the value of $V_A$ is calculated for glass workpieces having differing resistivities and capacitance. From the calculated values of $V_A$, time durations are calculated to reach the balanced charge condition for different values of reverse polarity voltages at terminal 40 at the completion of workpiece processing. These times are stored in ROM 68 and supplied to microprocessor 66 to control the length of time the reverse voltage is applied by source 38 to plate 36 via terminal 40. If, for example, the applied reverse voltage has a magnitude of 4,000 volts, equalization of charge in $C_G$ and $C_A$ is achieved in 53 seconds for a particular glass workpiece. At 53 seconds, the voltage between the upper and lower faces of such a workpiece 32 is about −3,830 volts, while the clamping voltage between the lower face of insulator 59 and the lower face of the workpiece is about −170 volts. When charge equalization occurs, microprocessor 66 reduces the voltage of source 36 to zero and the clamping voltage $V_A$ discharges quickly to zero. Then lifting pins remove workpiece 32 from chuck 30.

The charge balancing embodiment is particularly applicable to low resistivity glass workpieces. The reverse polarity voltage is left on for a long enough time to prevent the workpiece from sticking. The charge balancing reverse polarity embodiment is associated with the discharge time constant $\tau^-$.

In the charge balancing embodiment the voltage approximately equals the ratio of the voltages $$\frac{|V_{ESC}|}{V_A} 10$$

at the start of the reverse polarity process. The ratio $$\frac{|V_{ESC}|}{V_A} 11$$

can be as high as the capacitance ratio $$\frac{C_A}{C_G} 12.$$

The charge balancing reverse polarity process therefore decreases the length of time of the dechucking operation by a factor of 10 or 20 times. For low resistivity glass workpieces, this means the workpiece is released in approximately 50 seconds, instead of almost 1,000 seconds. However, the charge balance reverse polarity process is excessively long for glass workpieces having intermediate resistivities.

The reverse polarity voltage in the first reverse polarity embodiment preferably has a magnitude controlled by the amount of clamping charge on capacitor $C_A$ (between the lower face of insulator 59 and the lower face of workpiece 32) as workpiece 32 is lifted from chuck 30. Since the passive electric parameters of the glass workpieces in a particular batch are similar and resistivity is a function of workpiece temperature, the amount of charge on capacitor $C_A$ for a particular workpiece at the time the workpiece is lifted from chuck 30 preferably controls the amplitude of the reverse polarity voltage applied by source 38 to chuck 30 for the next processed workpiece. In fact, the charge on capacitor $C_A$ at the time a particular workpiece is removed from chuck 30 can be used to control the magnitude and/or duration of the reverse polarity voltage during removal of the next several (e.g., up to about 10) workpieces 32 from chuck 30.

To monitor the charge on capacitor $C_A$ at the time a particular workpiece 32 is lifted from chuck 30, ammeter 61 responds to the current pulse flowing through terminal 40 and plate 36 of chuck 30 while the lifting pins remove the particular workpiece 32 from chuck 30 while an inert r.f. plasma is in chamber 10. The inert r.f. plasma is applied to the chamber after plasma processing has been completed and the processing plasma has been extinguished. Microprocessor 66 responds to the peak current pulse amplitude or the integrated current detected by meter 61 to control the amount of charge applied during one or more subsequent reverse polarity voltage steps. The amount of charge difference applied by the reverse polarity voltage relative to the last time meter 61 controlled the reverse voltage charge is inversely proportional to the current meter 61 detects relative to the previous detected reading of meter 61.

In the first embodiment, the reading of meter 61 controls the amplitude of the reverse polarity voltage and/or the length of time the reverse polarity voltage is applied by source 38 to chuck 30. Ideally, no current flows if the substrate was perfectly dechucked. If the most recent peak current increases in amplitude relative to the immediately preceding peak current, microprocessor 66 increases the amplitude of the applied reverse voltage and/or the length of time the reverse voltage is applied. If, however, the most recent peak current is negative in amplitude relative to the immediately preceding peak current, microprocessor 66 decreases the amplitude of the applied reverse polarity voltage and/or the length of time the reverse polarity voltage is applied to chuck 30.

Figure 6:
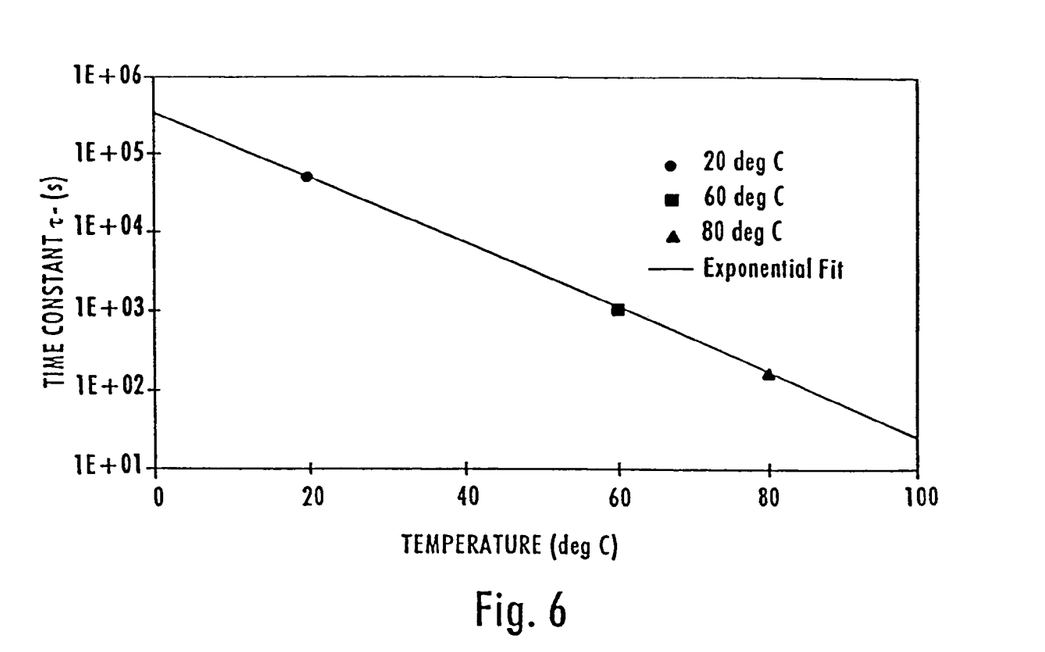
FIG. 6 is an approximate equivalent plot of discharge time constant ($\tau^-$) as a function of temperature for a typical intermediate resistivity glass workpiece.

The electrical resistivity of low and intermediate resistivity dielectric glass workpieces strongly depends on workpiece temperature as shown by Table I (supra). FIG. 6 is a plot of the discharge time constant $\tau^-$ for a typical intermediate resistivity glass as a function of temperature. Since resistivity decreases approximately 2.5 times for every 10° C. increase in glass workpiece temperature, warm glass workpieces tend to dechuck more quickly than cool glass workpieces stuck by the same initial force to the chuck. To take advantage of this phenomenon, workpiece temperature is maintained approximately constant at a high level or is increased somewhat upon the completion of workpiece processing, until dechucking is completed.

During processing of workpiece 32, the plasma elevates the workpiece temperature to a relatively high value, such as 80° C. At 80° C., glass workpiece 32 has a significantly lower resistivity than the glass has at lower temperatures, such as 20° C. However, completion of processing of workpiece 32 is accompanied by ROM 68 supplying microprocessor 66 with signals causing closure of valve 21 in the process gas supply conduit and cutoff of r.f. source 26, to extinguish the plasma in chamber 10. Because the plasma is extinguished, the temperature of workpiece 32 tends to decrease.

To maintain workpiece 32 at the elevated temperature after workpiece processing has been completed, ROM 68 supplies microprocessor 66 with a signal which causes the microprocessor to close valve 35 in helium cooling line 34 substantially simultaneously with plasma extinction. The workpiece remains at the relatively high temperature and low electrical resistivity it had at the end of processing because there is poor thermal contact between workpiece 32 and chuck 30 when no helium flows into the chuck. The low electrical resistivity enhances dechucking of workpiece 32 from chuck 30 during the reverse polarity procedure.

After the reverse polarity procedure has been completed for the second embodiment and while the pins position workpiece 32 above chuck 30, charge between the top and bottom faces of workpiece 32 is removed by turning on a low power inert plasma for a few seconds, as described supra. The charge across workpiece 32 can also be dissipated in this way by establishing a DC Townsend discharge across the faces of the glass workpiece by introducing an ionizable gas, such as argon or oxygen at a pressure of a few milliTorr, into chamber 10 via valve 21. For the first reverse voltage embodiment, the plasma is on while the pins lift the workpiece to remove the charge between the workpiece top and bottom faces.

While there have been described and illustrated specific embodiments of the invention, it will be clear that variations in the details of the embodiments specifically illustrated and described may be made without departing from the true spirit and scope of the invention as defined in the appended claims.

We claim:

1. Apparatus for facilitating dechucking a workpiece from an electrostatic chuck in a vacuum plasma processor including a vacuum plasma processor chamber, the processor chamber including an electrostatic chuck for chucking the workpiece, the chuck including an electrode responsive to a DC chucking voltage source, the DC chucking voltage source being arranged to derive a chucking voltage having a value for producing a chucking force to hold the workpiece on the chuck, the apparatus comprising a monitor for monitoring electric current flowing in the chuck as the workpiece is being removed from the chuck, a controller for controlling the DC voltage applied to the electrode, the controller being arranged for (a) reversing the voltage applied to the electrode as processing of the workpiece is being completed and (b) controlling the reverse voltage applied to the chuck in response to the monitored current for at least one workpiece processed subsequently to the workpiece which resulted in the current being monitored.

2. The apparatus of claim 1 wherein the controller is arranged to control the magnitude of the reverse voltage.

3. The apparatus of claim 1 wherein the controller is arranged to control the duration of the reverse voltage.

4. The apparatus of claim 3 wherein the controller is arranged to control the magnitude of the reverse voltage.

5. A vacuum plasma processor for processing a workpiece, comprising a vacuum plasma processor chamber, an electrostatic chuck in the chamber, the chuck including, an electrode, a DC chucking voltage source connected to the electrode, a plasma source for the chamber, the workpiece being processed by the plasma in the chamber while the workpiece is held in situ on the chuck, the DC chucking voltage source being arranged to derive a chucking voltage having a value for producing a chucking force on the workpiece for holding the workpiece in situ on the chuck, a controller, the controller being arranged for:
   (a) reversing the voltage applied to the electrode as processing of the workpiece is being completed,
   (b) controlling removal of the workpiece from the chuck after the reverse voltage has been applied to the electrode and while the force applied to the workpiece by the chuck is substantially zero, and
   (c) controlling the reverse voltage applied to the chuck;
   a monitor for electric current flowing in the chuck;
   the controller being arranged to respond to the monitored current while the workpiece is being removed from the chuck to control the reverse voltage applied to the chuck for at least one workpiece processed subsequently to the workpiece which resulted in derivation of the monitored current.

6. The apparatus of claim 5 wherein the controller is arranged to control the magnitude of the reverse voltage.

7. The apparatus of claim 5 wherein the controller is arranged to control the duration of the reverse voltage.

8. The apparatus of claim 7 wherein the controller is arranged to control the magnitude of the reverse voltage.

9. Apparatus for facilitating dechucking a workpiece from an electrostatic chuck of a vacuum processor, the chuck being arranged to be responsive to a DC chucking voltage of a DC source for applying an electrostatic chucking force to the workpiece to hold the workpiece in situ on the chuck during workpiece processing, the apparatus comprising a conduit for coupling a fluid through the chuck to the workpiece, the fluid having a tendency to move the workpiece relative to the chuck, the force applied by the chuck to the workpiece including the combination of the fluid force and the electrostatic chucking force, a monitor for effectively monitoring the electrostatic force applied to the workpiece by the chuck while the workpiece is being processed, and a controller arranged to be responsive to the monitored force for controlling the applied electrostatic force while the workpiece is being processed, the chuck and the workpiece being such that the electrostatic chucking force has a tendency to increase as time progresses if the DC chucking voltage is constant, the controller being arranged for gradually decreasing the DC chucking voltage as a function of time during workpiece processing, the gradually decreasing DC chucking voltage as a function of time being such that the electrostatic force remains substantially constant during workpiece processing.

10. The apparatus of claim 9 wherein the controller is arranged for gradually decreasing the DC chucking voltage in accordance with a continuous exponential function of time or a series of decreasing steps approximating an exponential function of time.

11. A vacuum plasma processor for processing a workpiece comprising a vacuum plasma processing chamber, the chamber including an electrostatic chuck for chucking the workpiece, a DC chucking voltage source for the electrostatic chuck, the chuck and the workpiece being such that the electrostatic force has a tendency to increase as time progresses if constant DC voltage is applied to the chuck, and a controller for controlling the chucking voltage, the controller being arranged for gradually decreasing the DC chucking voltage through a gamut of values as a function of time during workpiece processing, the gamut of values being such that the electrostatic force remains substantially constant during workpiece processing.

12. The processor of claim 11 wherein the gamut of values is approximately a continuous decreasing exponential function.

13. The processor of claim 11 wherein the gamut of values is a series of decreasing steps approximating an exponential function.

14. The processor of claim 11 further including a memory storing the gamut of values.

15. The processor of claim 11 further including a monitor for the force applied by the chuck to the workpiece during workpiece processing, the monitor being coupled to the controller for causing derivation of the gamut of values.

16. A method of processing a workpiece in a vacuum plasma processing chamber, the chamber including an electrostatic chuck for chucking the workpiece, a DC chucking voltage source connected to the electrostatic chuck, the chuck and the workpiece being such that the electrostatic force has a tendency to increase as time progresses if constant DC voltage is applied to the chuck, the method comprising gradually decreasing the DC chucking voltage through a gamut of values as a function of time during workpiece processing, the gamut of values being such that the electrostatic force remains substantially constant during workpiece processing.

17. The method of claim 16 wherein the gamut of values is approximately a continuous decreasing exponential function.

18. The method of claim 16 wherein the gamut of values is a series of decreasing steps approximating an exponential function.

19. The method of claim 16 further including monitoring the force the chuck applies to the workpiece during workpiece processing, and deriving the gamut of values in response to the monitored force.

20. The method of claim 19 wherein the force monitoring step includes removing the workpiece from the chuck after processing of the workpiece has been completed and while the chuck applies no substantial force to the workpiece, and monitoring chucking electric current flowing in the chuck as the workpiece is removed from the chuck.

21. Apparatus for facilitating dechucking a workpiece from an electrostatic chuck in a vacuum plasma processor including a vacuum plasma processor chamber, the processor chamber including an electrostatic chuck for chucking the workpiece, the chuck including an electrode connected to be responsive to a DC chucking voltage source, the chucking voltage having a value for producing a chucking force to hold the workpiece on the chuck, the apparatus comprising a monitor for monitoring electric current flowing in the chuck as the workpiece is being removed from the chuck, a controller for controlling the DC voltage applied to the electrode, the controller being arranged for controlling the voltage applied to the electrode in response to the monitored current for at least one workpiece processed subsequently to the workpiece which resulted in the current being monitored.

22. The apparatus of claim 21 wherein the controller is arranged to control the magnitude of the voltage applied to the chuck.

23. The apparatus of claim 21 wherein the controller is arranged to control the duration of the voltage applied to the chuck.

24. The apparatus of claim 23 wherein the controller is arranged to control the magnitude of the voltage applied to the chuck.

25. A vacuum plasma processor for processing a workpiece, comprising a vacuum plasma processor chamber, an electrostatic chuck in the chamber, the chuck including an electrode, a DC chucking voltage source connected to the electrode, a plasma source for the chamber, the workpiece being processed by the plasma in the chamber while the workpiece is held in situ on the chuck, the chucking voltage having a value for producing a chucking force on the workpiece for holding the workpiece in situ on the chuck, and a monitor for electric current flowing in the chuck as the workpiece is being lifted from the chuck.

* * * * *